US00RE37311E

(19) United States
(12) Reissued Patent
Kato et al.

(10) Patent Number: US RE37,311 E
(45) Date of Reissued Patent: Aug. 7, 2001

(54) PARALLEL TYPE NONVOLATILE SEMICONDUCTOR MEMORY DEVICE AND METHOD OF USING THE SAME

(75) Inventors: Masataka Kato, Konganei; Tetsuo Adachi, Hachioji; Hitoshi Kume, Musashino; Takashi Kobayashi, Kokubunji, all of (JP)

(73) Assignee: Hitachi, Ltd., Tokyo (JP)

(21) Appl. No.: 09/453,079

(22) Filed: Dec. 2, 1999

Related U.S. Patent Documents

Reissue of:
(64) Patent No.: 5,793,678
Issued: Aug. 11, 1998
Appl. No.: 08/628,817
Filed: Apr. 5, 1996

(30) Foreign Application Priority Data

Apr. 6, 1995 (JP) ..... 7-081003

(51) Int. Cl.[7] ..... G11C 16/04
(52) U.S. Cl. ..... 365/185.27; 365/185.06; 365/185.26
(58) Field of Search ..... 365/185.06, 185.27, 365/185.26, 189.05

(56) References Cited

U.S. PATENT DOCUMENTS 4,881,201 * 11/1989 Sato et al. ..... 365/185.06
5,402,374 * 3/1995 Tsuruta et al. ..... 365/185.06
5,504,706 * 4/1996 D'Arrigo et al. ..... 365/185.27
5,515,319 * 5/1996 Smayling ..... 365/185.06

* cited by examiner

*Primary Examiner*—A. Zarabian
(74) *Attorney, Agent, or Firm*—Antonelli, Terry, Stout & Kraus, LLP

(57) ABSTRACT

On a semiconductor substrate of a first conductive type is formed a well layer of the same conductive type as that of the substrate in electrically separated that is, physically separated and electrically isolated, from the substrate, and a MOS transistor, used as a nonvolatile memory cell, forming a drain region and a source region respectively within the well layer is used as a memory cell. Well layers associated with different columns are connected to each other by a well wiring commonly so that operation voltage different from that of the semiconductor substrate is applied thereto. In the case of data erasing, prescribed positive voltage is applied to a well wiring, and prescribed voltage lower than said positive voltage is applied to a selected word line. In the case of data programming, prescribed negative voltage is applied to the well wiring, prescribed voltage higher than said negative voltage is applied to the selected word line.

13 Claims, 8 Drawing Sheets

PARALLEL TYPE NONVOLATILE SEMICONDUCTOR MEMORY DEVICE AND METHOD OF USING THE SAME

Matter enclosed in heavy brackets [ ] appears in the original patent but forms no part of this reissue specification; matter printed in italics indicates the additions made by reissue.

BACKGROUND OF THE INVENTION

The present invention relates to a parallel type nonvolatile semiconductor memory device which is electrically programmable and erasable and a method of using the device, and more particularly to a parallel type nonvolatile semiconductor memory device applied, preferably, to a large scale integration scheme and a method of using the device.

In general, a parallel type nonvolatile semiconductor memory device which is electrically programmable and erasable is constituted, for example, by nonvolatile memory cells comprising a plurality of MOS field effect transistors (hereinafter referred to as "MOS transistors") each provided with an n-type drain region and an n-type source region formed on a p-type silicon substrate, a gate insulation film formed on a surface of the substrate including these regions, a floating gate formed on the insulation film, and a control gate formed on the floating gate through an interlayer insulation film and, respectively, are arranged in a matrix. The plural nonvolatile memory cells constituting a nonvolatile memory cell array are used in that control gates are connected to each other by individual word lines in each row of nonvolatile memory cell, drain regions are connected to each other by individual data lines in each column of nonvolatile memory cell, and source regions are connected to each other by individual source lines in each column (refer to Japanese Patent Laid-Open No. Hei 6-77437 for example).

Programming and erasing of data are performed by utilizing tunnel phenomena of electrons (Fowler-Nordheim phenomena: hereinafter referred to as "F-N phenomena") in a gate insulation film. That is, when negative voltage is applied to a control gate, positive voltage is applied to a drain region and a source region is held to the substrate voltage (zero voltage), the F-N phenomena are generated on the gate insulation film in an overlapped portion of the drain region and the floating gate, and electrons are ejected from the floating gate to the drain region and data is programmed.

On the other hand, when positive voltage is applied to the control gate and the drain region and the source region are held to the substrate voltage, the F-N phenomena are generated on the whole surface of the gate insulation film and electrons are injected from the whole of the channel region to the floating gate and data is erased.

In the prior art as above described, in order to write data efficiently, it is preferable that the drain region possesses a withstanding voltage of at least 6V or more. Therefore, it is necessary that an overlapped portion with length of at least 0.15 $\mu$m is formed between the floating gate and the drain region. Since the effective length of the floating gate, which can be formed by the process technology in the prior art, is about 0.4 $\mu$m even in the case of minimum, when the length of the overlapped portion is made about 0.15 $\mu$m, the channel length of about 0.15 $\mu$m can be secured by limiting the length of the overlapped portion of the floating gate and the source region to about 0.1 $\mu$m. Therefore, a method has been adopted in the prior art whereby the drain region is formed larger than the source region asymmetrically thereby the withstanding voltage of the drain region is secured.

However, in the present state that the process technology is developed significantly and the fine pattern processing of the floating gate with the effective length of about 0.25 $\mu$m becomes possible, even if the length of the overlapped portion of the floating gate and the source region and the channel length can be suppressed to about 0.05 $\mu$m and about 0.1 $\mu$m respectively, since the length of the overlapped portion of the floating gate and the drain region can not be made 0.15 $\mu$m or more, when the asymmetric structure as in the prior art is adopted, it is difficult that the high integration memory device of 256 mega bits or more be realized.

Besides this, in the prior art, when data is programmed, since positive voltage is applied to the drain region (data line) and negative voltage is applied to the control gate (word line), it can not be prevented that a leak current flowing through a depletion region (band-to-band tunneling current) is generated under the gate insulation film of the drain region. Positive holes as origin of this leak current are partly captured within the gate insulation film and accelerate the deterioration of the insulation film and cause the programming and erasing cycle to be decreased significantly.

SUMMARY OF THE INVENTION

An object of the present invention is to provide a semiconductor integrated circuit of novel configuration and its using method, where the above-mentioned problems in the prior art are solved, and a nonvolatile memory device having quite high density and being electrically programmable can be easily realized.

The problems in the present invention, as above described, can be solved in that on a semiconductor substrate of a first conductive type is formed a well layer having the same conductive type as that of the substrate and being electrically separated from the substrate, and a MOS transistor having a drain region and a source region respectively formed within the well layer is used as a memory cell. Well layers of a plurality of memory cells constituting a memory array are connected to each other by a well wiring commonly so that operation voltage different from that of the semiconductor substrate is applied thereto. Control gates are connected to each other, drain regions are connected to each other and source regions are connected to each other by individual word lines, data lines or source lines in each row or column in similar manner to that of the prior art as above described.

In a memory device and a method of use thereof according to the present invention, being different from the above-mentioned prior art in structure, injection of electrons to the floating gate is defined as data programming, and ejection of electrons from the floating gate is defined as data erasing. Erasing of data is performed in that prescribed positive voltage is applied to the well wiring and other prescribed voltage (for example, negative voltage) lower than the positive voltage is applied to a selected word line (a word line leading to a control gate of a memory cell desired to be erased). In this case, the voltage Vf applied to the floating gate of the selected memory cell becomes a value determined by formula (1), and as a result of that the high electric field shown in formula (2) is applied to the whole surface of the gate insulation film, the F-N phenomena are generated to the whole of the insulation film and electrons are ejected from the floating gate, and the threshold voltage of the memory cell can be selected to a lower range of 0.5V–1.5V. In addition, in formula (1) and formula (2), Vp indicates voltage applied to the well layer (subscript p means plus value), Vn indicates voltage of the control gate (subscript n means minus value), Cr indicates coupling ratio (ratio of capacitance of the gate to the whole capacitance viewing from the floating gate), and Tox indicates thickness of the gate insulation film respectively.

$$Vf=Cr(Vn-Vp)+Vp \quad (1)$$

$$-(Vf-Vp)/Tox \quad (2)$$

The data erasing can be executed regarding all memory cells connected to the selected word line collectively and simultaneously. Therefore, one word line is defined as a sector of 512 bytes for example, thereby the efficient data erasing in individual units of 512 bytes becomes possible. However, since positive voltage is applied to the well layers of the all memory cells through the well wiring, if an unselected word line is left to the open state, in memory cells connected to the word line, as a result of that a weak electric field directed from the floating gate towards the well layer is applied to the gate insulation film, erase-disturb phenomena are generated that electrons go out of the floating gate gradually. The phenomena can be prevented in that the intermediate voltage between the voltage of the selected word line and the voltage of the well wiring is applied to the unselected word line and the electric field applied to the gate insulation film is relieved.

On the other hand, programming of data is executed in that prescribed negative voltage is applied to the well wiring, and other prescribed voltage (for example, positive voltage) higher than the negative voltage is applied to a selected word line (a word line leading to a control gate of a memory cell desired to be programmed). In this case, the voltage Vf applied to the floating gate of the selected memory cell becomes a value determined by formula (3), and as a result of that the high electric field in the reverse direction shown in formula (4) is applied to the whole surface of the gate insulation film, the F-N phenomena are generated in the whole of the gate insulation film and electrons are injected to the floating gate, and the threshold voltage of the memory cell can be set to a higher range of 3.0V–4.0V. However, Vn and Vp in formula (3) and formula (4) are unlike the case of formula (1) and formula (2), and the former indicates negative voltage applied to the well wiring and the latter indicates positive voltage applied to the selected word line respectively.

$$Vf=Cr(Vp-Vn)+Vn \quad (3)$$

$$-(Vf-Vn)/Tox \quad (4)$$

In similar manner to the case of the data erasing, also the data programming can be performed regarding a plurality of all memory cells connected to the selected word line collectively and simultaneously. However, programming of "1" (programming selected) and programming of "0" (programming inhibited) to each memory cell depend on a value of voltage applied to each data line. That is, if negative voltage comparable with the voltage of the well wiring is applied to the data line leading to a memory cell desired to be programmed or if the data line is made the open state, as a result of that the drain region voltage becomes comparable with the well layer voltage, the electric field applied to the gate insulation film is strengthened and generation of the F-N phenomena is promoted, and electrons are injected to the floating gate and "1" is programmed. On the other hand, if prescribed positive voltage (for example, positive voltage with the same absolute value as that of the negative voltage applied to the well wiring) is applied to a data line leading to a memory cell not desired to be programmed, as a result of that the drain region is held to the positive voltage, the electric field applied to the gate insulation film is relieved and generation of the F-N phenomena is suppressed, and injection of electrons to the floating gate is stopped and "0" is programmed. According to the above-mentioned operation, the data programming to a plurality of memory cells on the selected word line becomes possible. Consequently, one word line is defined as a sector of 512 bytes for example, thereby the programming in individual units of 512 bytes becomes possible.

In the case of the data programming, however, since negative voltage or positive voltage is applied to individual data lines selectively, a parasitic MOS transistor existing between a plurality of memory cells connected to one data line and memory cells connected to other data line adjacent to the data line becomes the on-state and an unexpected wrong operation may be caused. Such obstruction can be easily prevented in that a memory cell isolation region penetrating the well layer is formed between memory cells adjacent to each other, or that the adjacent memory cells are electrically separated from each other using the SOI technology.

Also during the data programming period, since negative voltage is applied to the well layers of all memory cells, if the unselected word line is left to the open state, in the memory cell connected to the word line, as a result of that a weak electric field directed from the well layer towards the floating gate is applied to the whole surface of the gate insulation film, the programming disturb phenomena are generated in that electrons are gradually injected into the floating gate. The phenomena can be prevented in that the intermediate voltage between the voltage of the well wiring and the voltage of the selected word line is applied to the unselected word line and the electric field intensity applied to the gate insulation film is relieved.

In addition, individual data lines are preferably held to positive voltage comparable with the voltage applied to the well wiring or held to the open state during the data erasing period, in order to prevent the wrong operation of the memory cell. Also individual source lines are preferably separated from each other and held to the open state during the period of data erasing or data programming, so that the well layer voltage of the memory cell in the on-state is not undesirably shortcircuited to other memory cell on the selected word line.

Thus in any case of the data erasing and the data programming, since the F-N phenomena can be generated to the whole of the channel region can be utilized, the drain region and the source region can be made mutually symmetric structure.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

<Embodiment 1>

A first embodiment of the present invention will be described in connection with FIG. 1–FIG. 4 and FIG. 6–FIG. 9. In this embodiment, four memory cells are made array configuration using two word lines and two data lines respectively, but the number of memory cells or the number of word lines and data lines is not limited to this embodiment. In addition, FIG. 1 is a diagram showing voltage condition when data of memory cells on any one selected word line are erased, FIG. 2 is a diagram showing voltage condition when data is programmed in memory cells on any one selected word line, and FIG. 3 is a diagram showing voltage condition when data of memory cells on any one selected word line are read out.

Figure 1:
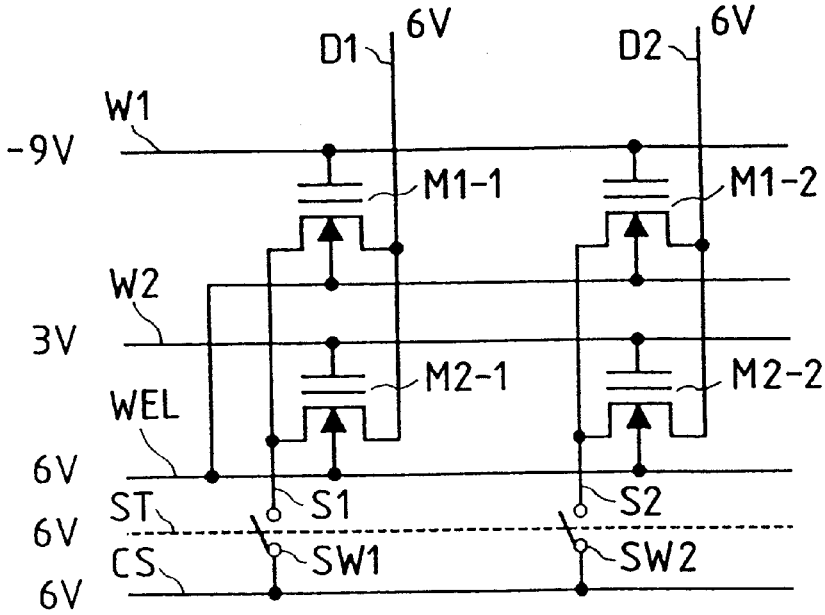
FIG. 1 is a circuit diagram of memory cells explaining a first embodiment of a parallel type nonvolatile semiconductor memory device according to the invention and showing voltage condition of the memory cells during the data erasing period.
Figure 2:
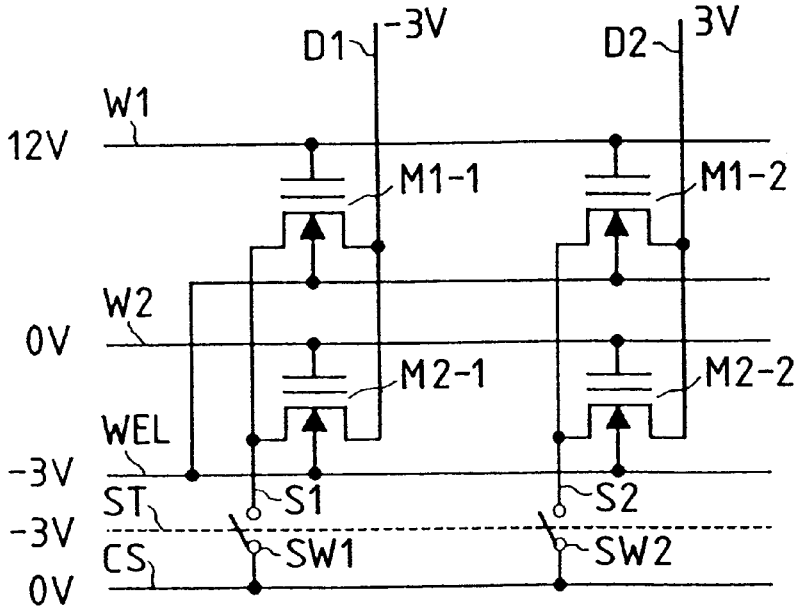
FIG. 2 is a diagram showing voltage condition of the memory cells shown in FIG. 1 during the data programming period.
Figure 3:
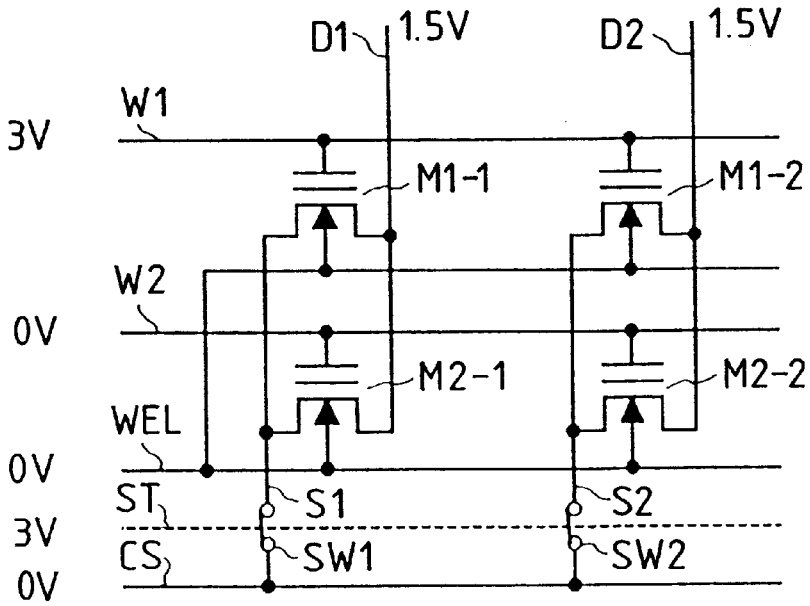
FIG. 3 is a diagram showing voltage condition of the memory cells shown in FIG. 1 during the data reading period.

In this embodiment, as shown in FIG. 1–FIG. 3, control gates of memory cells M1-1 and M1-2 are connected to each other by a word line W1, drain regions of memory-cells M1-1 and M2-1 are connected to each other by a data line D1, drain regions of memory cells M1-2 and M2-2 are connected to each other by a data line D2, source regions of memory cells M1-1 and M2-1 are connected to each other by a source line S1, source regions of memory cells M1-2 and M2-2 are connected to each other by a source line S2, and the source lines S1, S2 are connected through switching elements SW1, SW2 constituted by MOS transistors to a common line CS. The switching elements SW1 and SW2 have gates connected to each other commonly to a wiring ST, and both switching elements are switched simultaneously. In addition, in the case of this embodiment, although well layers of all memory cells are connected commonly by a well wiring WEL, when scale of array configuration is large, many memory cells may be separated into plural groups, for example, in unit of 1 mega bits or 4 mega bits, and memory cells in each group may be connected commonly by individual well wirings.

Figure 6:
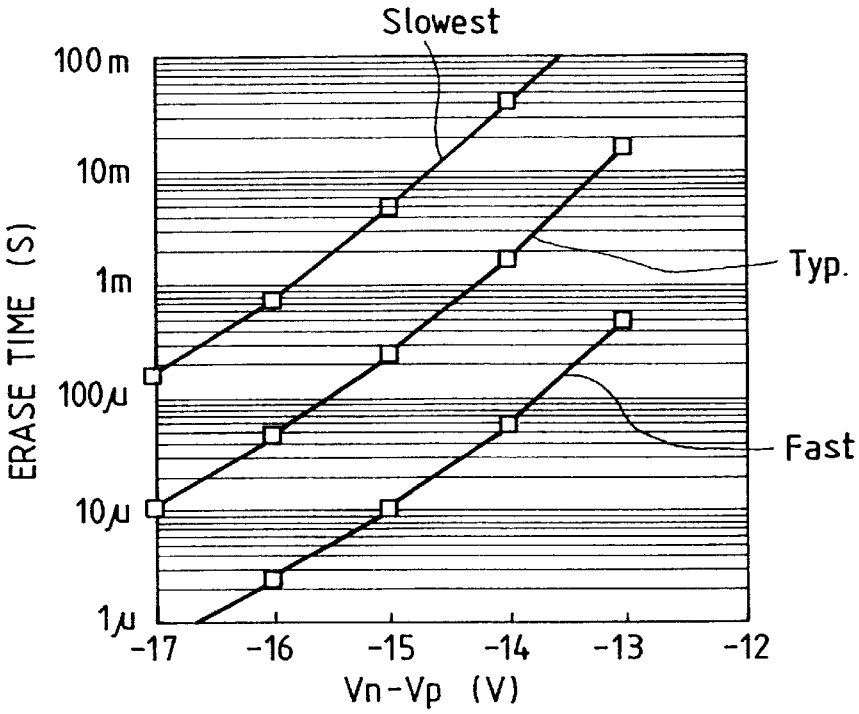
FIG. 6 is a curve diagram showing relation of voltage during the data erasing period and erasing time.
Figure 7:
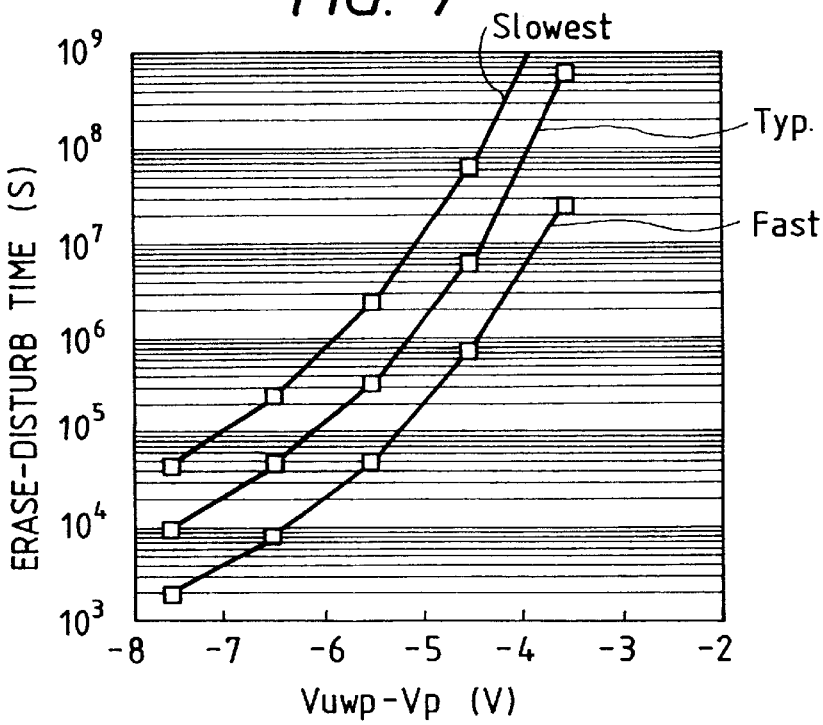
FIG. 7 is a curve diagram showing relation of erase-disturb time in an Unselected word line and voltage of the unselected word line during the data erasing period.

FIG. 1 shows voltage condition in the case of the data erasing. Individual voltages are set so as to satisfy various conditions of the threshold voltage of programming and erasing possessed by memory cells, thickness of the gate insulation film and the erasing time. FIG. 6 shows relation of the operation voltage (difference voltage between the voltage Vn of the selected word line and the voltage Vp of the well wiring) and the erasing time when thickness of the gate insulation film is 8.0 nm, and each curve of FIG. 6 indicates characteristics of the standard memory cell and characteristics of the fastest and slowest memory cells when the processing dispersion of memory cells is considered. In order to satisfy the maximum erase time of 10 ms for the slowest memory cell, the standard operation voltage (Vn–Vp) must be made −15V. Also in order that the number of memory cells connected to one data line is made 8192 (hence the number of word lines also is 8192) and the erasing and programming of 1,000 thousand times in the maximum erase time of 10 ms are enabled in each word line, one word line must withstand the erase-disturb time of about 80,000 thousand seconds (8E7s). From the erase-disturb characteristics after the programming of 1,000 thousand times shown in FIG. 7, in order to satisfy this condition, it is necessary that difference between the voltage Vuwp of the unselected word line and the positive voltage Vp of the well wiring is −3V or more.

Figure 8:
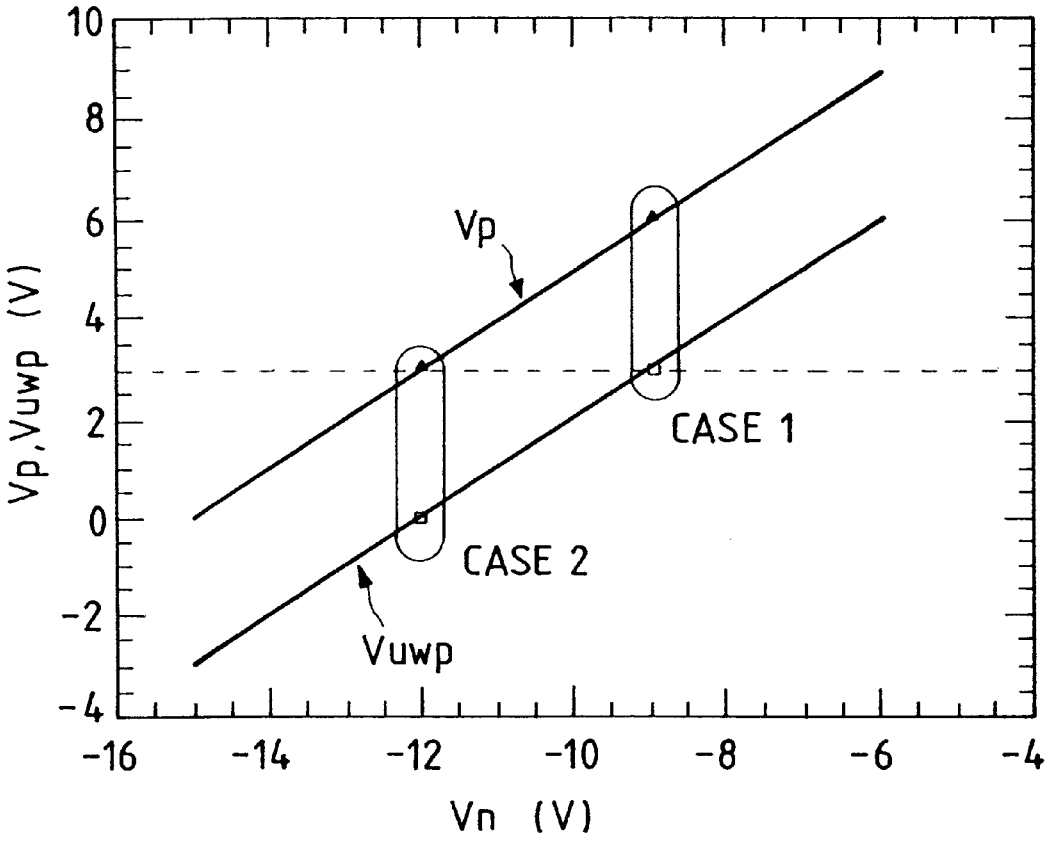
FIG. 8 is a line diagram showing relation of voltage of a well layer and voltage of an unselected word line to negative voltage of a selected word line during the data erasing period.

FIG. 8 shows the well wiring voltage Vp and the unselected word line voltage Vuwp to the negative voltage Vn of the selected word line. However, at least one of the well wiring voltage Vp and the unselected word line voltage Vuwp preferably uses a power source for a semiconductor chip (here Vcc=3V), and two cases, case 1 and case 2, may be considered.

FIG. 1 shows the case in case 1. In this case, the word line W1 is selected and the memory cells M1-1 and M1-2 are erased simultaneously. The selected word line W1 is supplied with −9V, the unselected word line W2 is supplied with 3V, and the well wiring WEL is supplied with 6V respectively. The switching elements SW1 and SW2 are driven by the common wiring ST, and held to the off-state during the period of the data erasing. The data lines D1 and D2 are set to 6V. If such voltage condition is set, in the memory cells M1-1 and M1-2, the strong electric field is applied to the whole surface of the gate insulation film and electrons are ejected from the floating gate to the channel region and the threshold voltage of the memory cells can be set to a range of 0.5V–1.5V. This lower positive threshold voltage state is defined as the data erasing state.

FIG. 2 shows condition during the data programming period determined by the voltage setting method in similar manner to the case of the data erasing. Also the data programming is performed in unit of the word line, and the selected word line W1 is supplied with 12V, the unselected word line W2 is supplied with 0V and the well wiring WEL is supplied with −3V. The switching elements SW1 and SW2 are held to the off-state during the programming period and the source line is in the open state. The data line D1 to the memory cell M1-1 performing the programming of the data "1" is supplied with −3V; and the data line D2 to the memory cell M1-2 performing the programming of the data "0" is supplied with 3V. If such voltage condition is set, in the memory cell M1-1, since the voltage of the channel region becomes about −3V, the voltage of the floating gate becomes voltage (for example, 6V) in the capacitance dividing by 12V of the word line and −3V of the channel region. On the other hand, in the memory cell M1-2, since the channel region becomes about 3V, the voltage of the floating gate becomes about 2.4V. As a result, in the memory cell M1-1, the electric field applied to the gate insulation film becomes stronger in comparison with the memory cell M1-2, and electrons are injected from the channel region to the floating gate through the whole surface of the gate insulation film, and the memory threshold voltage can be set to 3.0V–4.0V. This higher positive threshold voltage state is defined as the data programming state.

In addition, in this embodiment, the unselected word line W2 is supplied with 0V, and the high electric field is applied to the gate insulation film of the memory cell on the unselected word line so that electrons are prevented from leaking. The voltage supplied to the unselected word line W2 is not limited to 0V, but negative voltage may be applied thereby the electric field intensity may be further reduced.

Figure 4:
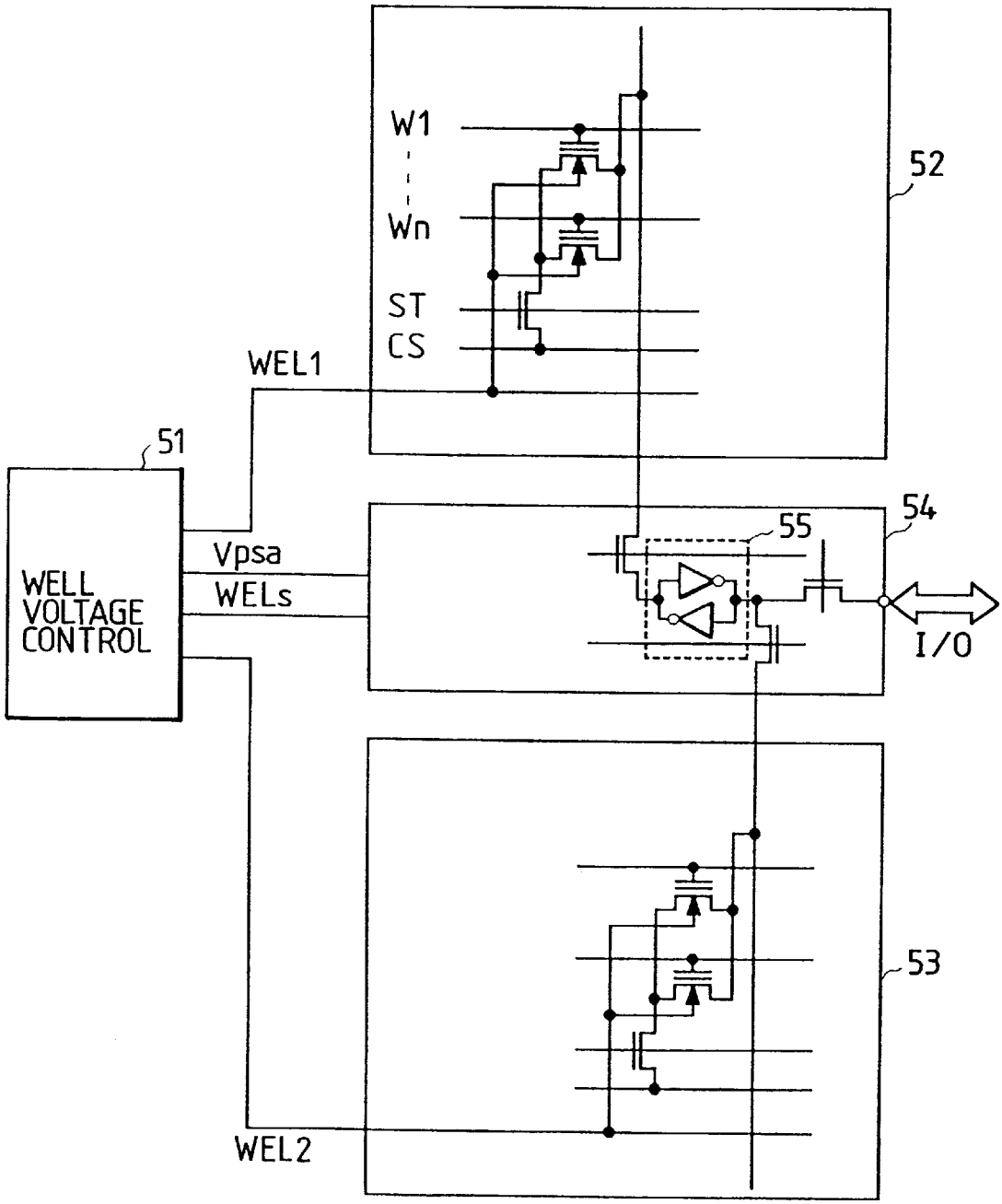
FIG. 4 is a circuit configuration diagram showing a block configuration of the first embodiment.

In the programming operation, the negative voltage (−3V) must be applied to the selected data line D1. FIG. 4 shows a block configuration example of a memory array so as to output the negative voltage to the data line D1. In this example, a sense circuit region 54 with a latch circuit 55 (differential pair) for the data storage during the programming period or the data reading provided in each data line is formed corresponding to memory arrays 52, 53, and a well voltage control circuit 51 for supplying the well layer voltage is connected to the memory arrays 52, 53 and the sense circuit region 54. That is, a well wiring WEL1 is connected between the well voltage control circuit 51 and the memory array 52, a well wiring WEL2 is connected between the well voltage control circuit 51 and the memory array 53, and a well wiring WELs and a wiring Vpsa of the positive voltage source are connected between the well voltage control circuit 51 and the sense circuit region 54 respectively. During the programming period, each voltage of the well wirings WEL1, WEL2, WELs is made the same voltage of −3V. The voltage of the power source wiring Vpsa is 3V. Such voltage condition is set thereby the latch circuit 55 can select and store −3V or 3V. Data are sent from a terminal I/O, and the storage state of the latch circuit 55 is set. Thus the voltage of the data line can be made −3V or 3V. In addition, in the reading operation as described later, the well voltage of the sense circuit region 54 is changed to 0V, and conventional reading operation is enabled.

FIG. 3 shows voltage condition during the data reading period. Also the reading is performed in unit of the word line, and the selected word line W1 is supplied with 3V. The unselected word line W2 is supplied with 0V, and the well wiring WEL is supplied with 0V. The switching elements SW1 and SW2 are held to the on-state, and the data lines D1, D2 are supplied with 1.5V. When the threshold voltage of the memory cell is low, the data line voltage is lowered, and when the threshold voltage of the memory cell is high, the data line voltage is held to 1.5V. Consequently, the data line voltage is detected in each data line thereby the information of the memory cell can be read out.

Figure 9:
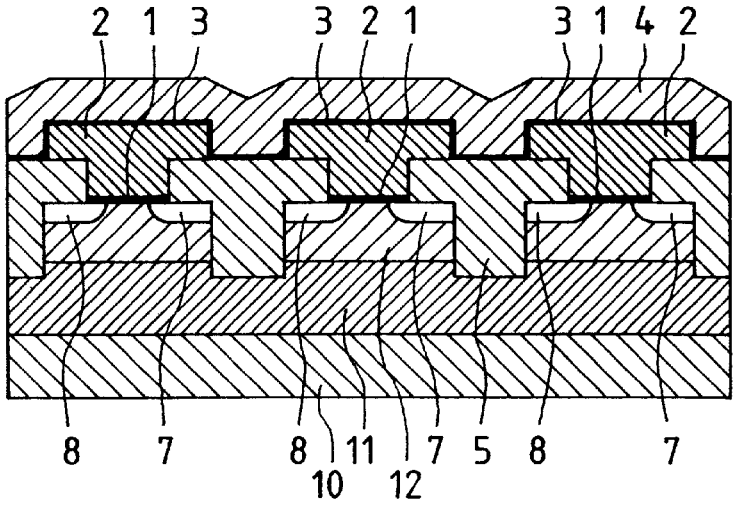
FIG. 9 is a sectional view explaining structure of the first embodiment.

FIG. 9 shows a semiconductor memory device to be used in this embodiment, for example, as a memory cell sectional structure corresponding to 3 bits. In the case of this embodiment, a semiconductor substrate 10 made of p-type silicon is used, and on an upper layer portion of the substrate 10, an n-type well layer 11 and an p-type well layer 12 are formed in sequence, and a drain region 7 and a source region 8 are formed within the p-type well layer 12. A gate insulation film 1 being a tunnel region is formed on the surface of the well layer 12, and on the gate insulation film 1, a floating gate made of highly impurity doped polysilicon or metal such as tungsten is formed. The surface of the floating gate 2 is covered by an interlayer insulation film 3 comprising a silicon oxide film 3 formed by the CVD method, and on the film 3, a word line 4 made of highly impurity doped polysilicon or metal such as tungsten is formed. This word line 4 acts also as a control gate. Memory cells are electrically insulated from each other by a memory cell isolation region 5. The memory cell isolation region 5 can be constituted in that a silicon oxide film is embedded within a groove formed on the silicon substrate 10, for example, by the anisotropic etching. The drain region 7 and the source region 8 are formed in symmetry with respect to the floating gate 2. Thereby the effective data length of the floating gate can be made 0.25–0.2 $\mu$m. By this effective data length, the high integration memory device of 256 mega bits or more can be realized.

In this embodiment, since the voltage of the p-type well layer 12 is voltage applied to the well wiring WEL shown in FIG. 1–FIG. 3, it is 6V during the data erasing period, −3V during the data programming period and 0V during the data reading period. On the other hand, the semiconductor substrate 10 is always grounded, and the voltage is 0V. Therefore, to the n-type well layer 11, 6V is applied during the data erasing period, 3V or 0V is applied during the data programming period, and 3V or 0V is applied during the data reading period respectively, and reverse bias or 0 bias is applied between the n-type well layer 11 and the p-type well layer 12 thereby the p-type well layer 12 is always insulation electrically with respect to the semiconductor substrate 10.

In this embodiment as above described, since memory cells connected to the same data line/source line are connected in parallel, the data reading can be performed at high speed. Also since the data programming and the data erasing are performed by the injection and the ejection of electrons due to the F-N tunnel phenomena using the whole surface of the channel of memory cell, excessive current component other than the tunnel current is not necessary, and since the tunnel current is weak, the low consumption power can be intended. Further, operation of a memory chip by single power source becomes possible. In this case, of course, a step-up circuit for generating high positive voltage (12V) and a step-down circuit for generating negative voltage (−9V) are necessary. Here, in any case of the data erasing and the data programming, the voltage difference between the selected word line and the unselected word line is 12V or less, and even if the voltage variation in the internal power source is considered, a MOS transistor having a drain withstanding voltage of 15V is used thereby a decoder circuit applying voltage selectively to a word line can be designed. Further, the absolute value of the voltage applied to the well layer is about 3V, and the disturb withstanding property to the thickness of the gate insulation film of 7 nm or more can be secured sufficiently in the case of data reading, data erasing and data programming. Also the drain region and the source region need to be formed in asymmetry, and the miniaturization of the memory cell can be intended and the process can be simplified. In addition, in this embodiment, although a method of realizing the data programming and the data erasing in unit of the word line is shown, several word lines may be bundled and made a block and the erasing may be performed in this unit. This block erasing method leads to the moderating of the condition shown in FIG. 7 and FIG. 8, and thereby avoids problems associated therewith.

<Embodiment 2>

Figure 5:
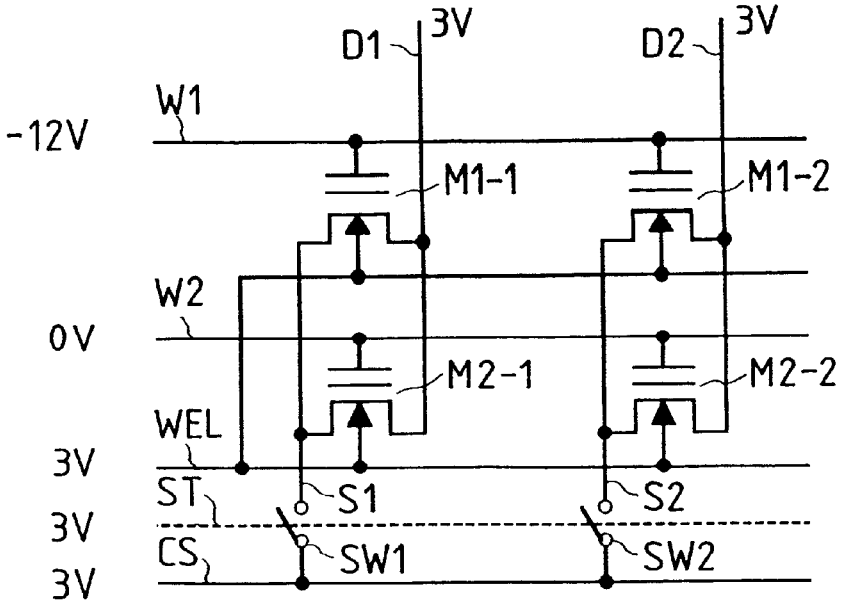
FIG. 5 is a circuit diagram of memory cells explaining a second embodiment of the invention and showing voltage condition of the memory cells during the data erasing period.

A second embodiment of the present invention will be described using FIG. 5. This embodiment uses case 2 among the data erasing conditions shown in FIG. 8, in which the voltage condition of the data erasing is made the condition shown in FIG. 5. In FIG. 5, a selected word line is made W1, and memory cells M1-1 and M1-2 are erased simultaneously. The selected word line W1 is supplied with −12V, an unselected word line W2 is supplied with 0V, and a well WEL is supplied with 3V. Switching elements SW1 and SW2 constituted by MOS transistors are set to the off-state, and drain of each memory cell is set to 3V. If such voltage condition is set, in the memory cells M1-1 and M1-2, a strong electric field is applied to the whole surface of a gate insulation film between a floating gate and a channel region and electrons are ejected from the floating gate to the channel region, and the threshold voltage of the memory cell can be set to a range of 0.5V–1.5V. In similar manner to FIG. 1, this lower position threshold voltage state is defined as the erasing state.

In this embodiment, −12V and 3V are used as voltages during the data erasing period, and since 3V is the power source voltage, it is seen that the voltage to be generated within the chip may be −12V only. Also in this embodiment, since the data programming and the data erasing are performed using the F-N tunnel phenomena, the external power source of the semiconductor chip can be made single, and, of course, the data programming and the data erasing are possible in unit of the word line. Also since the data programming and the data erasing are performed using the whole surface of the channel region, the drain region and the source region can be formed mutually in symmetric structure and the memory cell can be miniaturized.

<Embodiment 3>

Figure 10:
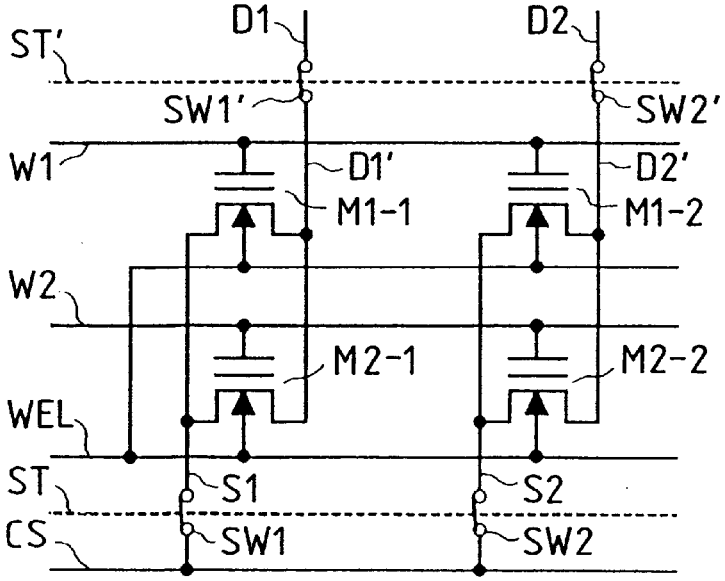
FIG. 10 is a circuit diagram of memory cells explaining a third embodiment of the invention.

A third embodiment of the present invention will be described using FIG. 10 and Table 1. In this embodiment, in comparison with the first embodiment shown in FIG. 1, a switch by way of a MOS transistor is added to each data line in similar manner to the provision of a MOS transistor switch at each source line. That is, as shown in FIG. 10, each of local data lines D1', D2' is connected through switching elements SW1', SW2' constituted by MOS transistors to each of main data lines D1, D2. Table 1 shows the voltage condition of each signal line.

TABLE 1

| Symbol | Wiring | Erase | Program | Read |
|---|---|---|---|---|
| W1 | selected word line | −9 V | 12 V | 3 V |
| W2 | unselected word line | 3 V | 0 V | 0 V |
| WEL | well wiring | 6 V | −3 V | 0 V |
| D1/D2 | data line | 6 V | −3 V/3 V | 1 V |
| CS | common source line | 6 V | 0 V | 0 V |
| ST | common wiring (source side) | 6 V | −3 V | 3 V |
| ST | common wiring (data side) | 6 V | 6 V | 3 V |

Operation of this embodiment is similar to that of the first embodiment in the present invention, and particularly a signal voltage to control a switch at the data line side is newly added to a common wiring ST'. Since the switching elements SW1', SW2' at the data line side (similarly to that of switching elements SW1, SW2 on the source line side) are formed within the same well layer as the memory cell, in order to transmit the main data line voltage of 3V to the local data line during the data programming period, 6V is applied to the common wiring ST'. This voltage is provided considering the substrate bias effect of the MOS transistors constituting the switching elements SW1', SW2'.

A region partitioned by the switching elements (SW1, SW2) at the source line side and the switching elements (SW1', SW2') at the data line side shall be called a block. In FIG. 10, within the block, only two word lines W1 and W2 exist for convenience, but it is preferable in designing a decoder circuit at the word line side that the actual number of word lines assigned to a block be the n-th power of 2, such as 16, 32, 64, etc.

In this embodiment, since the number of the memory cells connected to the data line is divided by the block, the data line capacitance reduced and the charge/discharge current of the data line using the internal power source is reduced.

<Embodiment 4>

Figure 11:
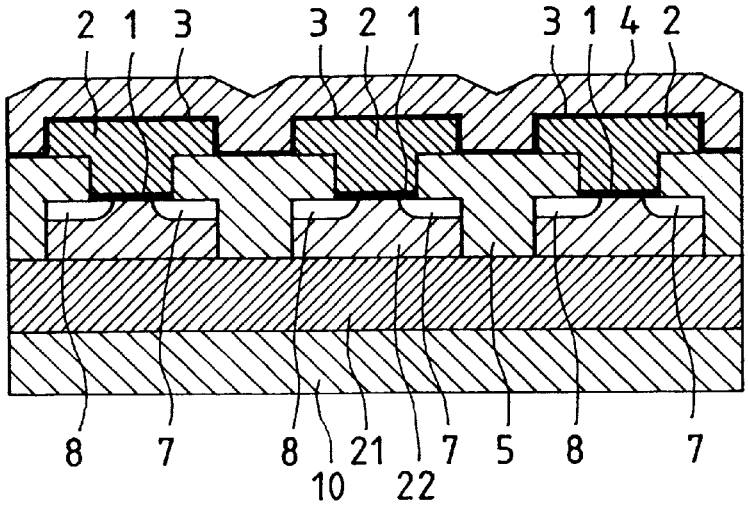
FIG. 11 is a sectional structure diagram explaining a fourth embodiment of the invention.

A fourth embodiment of the present invention will be described using FIG. 11–FIG. 13 and Table 2. In this embodiment, a semiconductor memory device is formed on an SOI substrate formed, for example, by a wafer bonding method, and an example of performing the operation of the present invention is shown. As shown in FIG. 11, on the SOI substrate, i.e., a semiconductor substrate 10 made of silicon, a silicon oxide film region 21 and a silicon layer 22 are formed, and the silicon layer 22 is made a well layer (p-type diffusion layer region). An active region of a memory cell is formed within the well layer. A memory cell isolation region 5 formed by the oxidation process is formed to attain the region 21, and the active region of each memory cell is electrically separated. In addition, FIG. 11 shows a sectional structure taken on line A–A' of a layout diagram in FIG. 13 described later.

Figure 12:
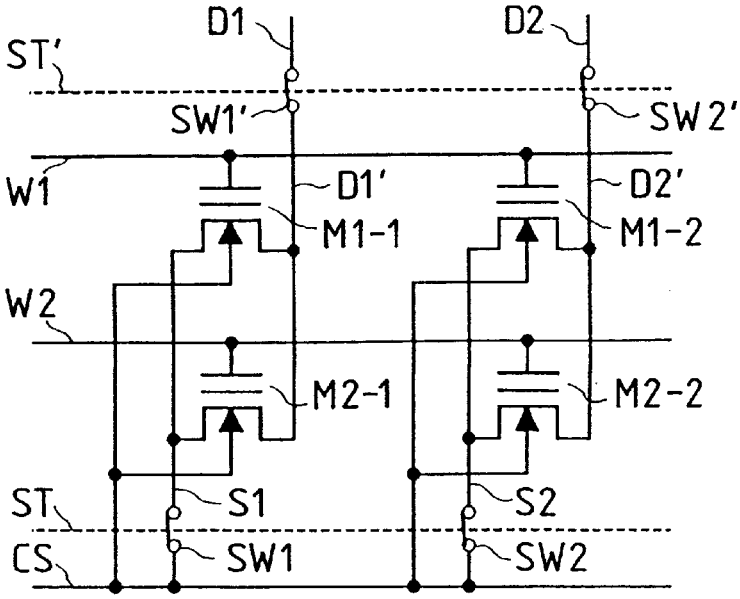
FIG. 12 is a circuit diagram explaining memory cells adopted in the fourth embodiment of the invention.

FIG. 12 shows a configuration example of a circuit adopting memory cells having a structure of FIG. 11. The circuit configuration is based on the third embodiment, but the first embodiment may be applied and the MOS transistor at the data line side may be omitted. In this embodiment, since a strong electric field must be generated by the voltage difference between the voltage supplied to the well layer and the voltage of the floating gate so that the tunnel phenomena are generated in the gate insulation film, the voltage for the data erasing and the data programming must be applied to the well respectively. In this embodiment, the well layer separated in each data line is connected to the common line CS, and the voltage is supplied from the common source line CS to the well layer. Table 2 shows the voltage condition of the operation.

TABLE 2

| Symbol | Wiring | Erase | Program | Read |
|---|---|---|---|---|
| W1 | selected word line | −9 V | 12 V | 3 V |
| W2 | unselected word line | 3 V | 0 V | 0 V |
| D1/D2 | data line | 6 V | −3 V/3 V | 1 V |
| CS | common source line | 6 V | −3 V | 0 V |
| ST | common wiring (source side) | 6 V | −3 V | 3 V |
| ST | common wiring (data side) | 6 V | 6 V | 3 V |

Particularly, during the data programming period, the voltage of the common source line CS is made −3V hence the voltage of the well layer is made −3V. Since the source line formed in each data line must also be in the open state, −3V is applied to the common wiring ST and the MOS transistor at the source side is made the off-state.

Figure 13:
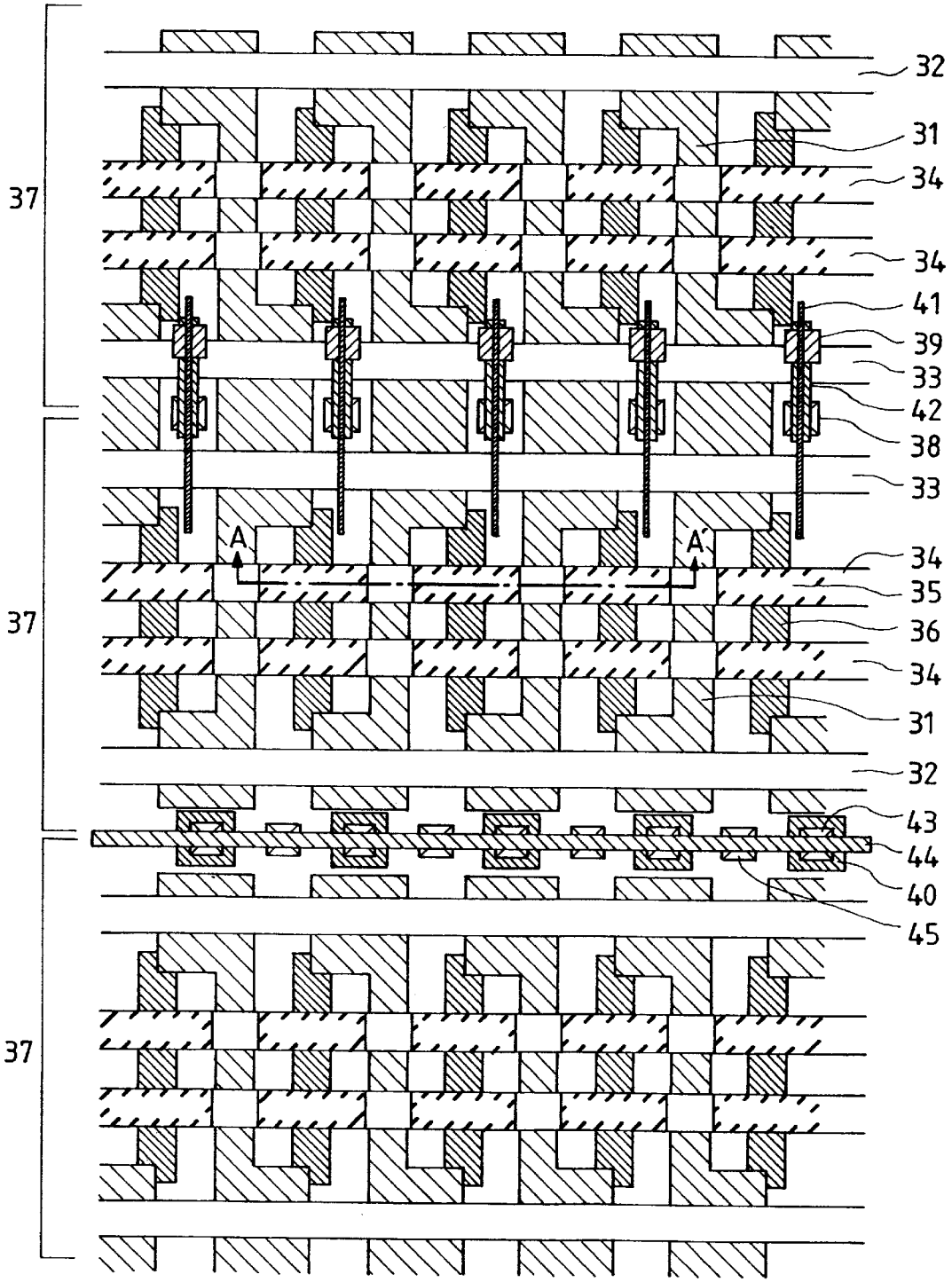
FIG. 13 is a plan view explaining an example of layout adopted in the fourth embodiment of the invention.

FIG. 13 shows an example of layout of the circuit shown in FIG. 12. A gate wiring 33 (common wiring) of a MOS transistor at the drain side, a gate wiring 32 (common wiring) of a MOS transistor at the source side and a word line 34 are formed within a block 37. In this embodiment, an example of two word lines is shown, but the invention is not limited to this. The memory cell region is electrically separated by a memory cell isolation region 31, and a floating gate 35 is formed within an active region under the word line 34. Parallel-connected memory cells, connected to a local data line, are formed in each p-type diffusion layer region 36 (well layer). Except for the memory cell isolation region 31, the p-type diffusion layer region 36, the memory cell and the channel region of the MOS transistor, the surface of the semiconductor substrate is covered by the n-type diffusion layer. The data line is connected through a second layer wiring 41, a through hole 39, a first layer wiring 42 and a contact 38 to an n-type diffusion layer covering the silicon substrate, and is connected through a MOS transistor (under the gate wiring 33) to an n-type diffusion layer at the drain side (local data line and drain). A common source line connected through a first layer wiring 44 and a contact 45 to an n-type diffusion layer covering the surface of the semiconductor substrate, and is connected through a MOS transistor (under the gate wiring 32) to an n-type diffusion layer at the source side (source line and source). Further the common source line is electrically connected through the first layer wiring 44 and a contact 43 to a region where a p-type diffusion layer 40 is formed. Thus in each column, a contact region supplying voltage to a well layer is provided, and the erase of the memory cell is made easy.

In this embodiment, making the most of the feature of the SOI substrate, the active region is electrically separated in each memory cell connected in parallel to the local data line, and the command for the memory cell isolation region such as the high threshold voltage or the high withstanding voltage required in the nonvolatile semiconductor memory device can be satisfied.

According to the present invention, the programming of data and the erasing of data can be respectively performed simultaneously for a plurality of memory cells connected to one word line. That is, since unit of the data programming and unit of the data erasing are equal, when the programming of data is performed, the data erasing may be performed for the word line only, and the data erasing for the memory cell data on other word line as seen in the block erase in the prior art need not be performed.

Also since the injection and the ejection of electrons due to the F-N phenomena of the whole surface of the channel region are utilized for the data programming and the data erasing, the mutual asymmetric structure need not be used for the drain region and the source region. Consequently, when the process technology of 0.25 $\mu$m or less is used for example, elongation of the drain region and the source region can be made about 0.5 $\mu$m respectively in symmetry, and the channel length of about 0.1 $\mu$m can be secured. As a result, the memory cell having the gate length of 0.2 $\mu$m can be manufactured.

Further in any case of the data programming and the data erasing, since the voltage in the channel region is uniform, generation of a leak current (band-to-band tunneling current) in the drain region is prevented, and deterioration of the insulation film attendant on the leak current can be avoided.

Thus the problems in the semiconductor memory device in the prior art are eliminated, and the high integration semiconductor memory device of 256 mega bits or more can be realized.

It is further understood by those skilled in the art that the foregoing description is a preferred embodiment of the disclosed device and that various changes and modifications may be made in the invention without departing from the spirit and scope thereof.

What is claimed is:

1. In combination with a semiconductor memory device comprising memory arrays connected in parallel, wherein each memory array has a plurality of memory cells which are electrically erasable and programmable, comprising MOS field effect transistors each having a control gate, a floating gate, a gate insulation film, a drain region and a source region formed on a semiconductor substrate, which are arranged in a matrix including plural rows and columns of memory cells over a surface of said semiconductor substrate, the control gates of memory cells in a single row are connected to each other by a word line corresponding to that row, the drain regions of memory cells in a single column are connected to each other by a data line corresponding to that column, and the source regions of memory cells in a single column are connected to each other by a source line corresponding to that column, the improvement which comprises a parallel type nonvolatile semiconductor memory device characterized in that:

each of said memory cells is comprised of one of said MOS field effect transistors, the MOS field effect transistors of memory cells disposed in each column having both the drain region and the source region thereof formed within a well layer, common to that column, formed on said semiconductor substrate which is of a first conductivity type, said well layer having the same conductivity type as that of said semiconductor substrate and being electrically separated from said semiconductor substrate, well layers of memory cells associated with different columns are commonly connected through well wiring, each said source line has a switching element connected thereto, said switching element comprising a MOS transistor having a drain region and source region thereof formed within the well layer of that column, and each said source line being connected through said switching element connected thereto to a common source line, said memory cells are divided into a plurality of blocks each of which has, in each column associated therewith, memory cells which are connected thereto, a respective said source line and a respective said switching element and has a rate wiring by which rates of switching elements in the corresponding block are connected to each other, all switching elements of a block are driven by the gate wiring thereof and are held to an off-state during the data erasing period and during the data programming period of that block, and each of said memory cells has a channel region under the floating gate the entirety of which is used to generate the Fowler-Nordheim tunnel phenomena.

2. A semiconductor memory device according to claim 1, wherein, in each of the MOS transistors of said plurality of memory cells, the drain region and the source region, formed within said well layer, have a mutually symmetric structure.

3. A semiconductor memory device according to claim 1, wherein the memory cells of one column, connected to one data line, and the memory cells of two other columns which are adjacent to said one column and are connected to two other data lines, respectively, are electrically insulated from each other by a memory cell isolation region disposed at the side of the drain regions and a memory cell isolation region disposed at the side of the source regions, and said switching element of a column is disposed between the memory cell isolation region at the side of the drain regions in that column and the memory cell isolation region at the side of the source regions in that column.

4. A semiconductor memory device according to claim 1, wherein a latch circuit previously storing data to be programmed in a memory cell is provided in each data line.

5. A method of using a semiconductor memory device according to claim 1, which comprises the steps of:

in the case of data erasing, applying a prescribed positive voltage to the well wiring, and applying a different prescribed voltage, more negative than said positive voltage to a selected word line; and in the case of data programming, applying a prescribed negative voltage to the well wiring, applying a different prescribed voltage, more positive than said negative voltage to the selected word line, applying a voltage comparable to the voltage applied to the well wiring to a selected data line, and electrically isolating the source lines corresponding to different columns of memory cells from each other and holding each source line to an open state.

6. A method of using a semiconductor memory device according to claim 5, wherein during the data erasing period, an intermediate voltage between that of the voltage applied to the selected word line and the voltage applied to the well wiring is applied to an unselected word line, and during the data programming period, an intermediate voltage between that of the voltage applied to the well wiring and the voltage applied to the selected word line is applied to an unselected word line, and a prescribed positive voltage is applied to an unselected data line.

7. A method of using a semiconductor memory device according to claim 6, wherein the intermediate voltage to be applied to the unselected word line during the data programming period is a voltage not exceeding the substrate voltage.

8. A method of using a semiconductor memory device according to claim 6, wherein, during the data erasing period, the data lines are held to a positive voltage comparable with the voltage applied to the well wiring or held to an open state.

9. A method of using a semiconductor memory device according to claim 6, wherein the source lines corresponding to different columns of memory cells are electrically isolated from each other and held to the open state during the data erasing.

10. A method of using a semiconductor memory device according to claim 5, wherein in the case of data erasing, data programming and data reading, the voltage applied to the well wiring and the voltage applied to the common source line are made equal.

11. A method of using a semiconductor memory device according to claim 6, wherein during the data programming period, the voltage applied to a well layer including a latch circuit and the voltage applied to the well layer of the memory cell for the data programming operation are made equal, said latch circuit, which is for storing data to be programmed in a memory cell, is provided for each data line.

12. A semiconductor memory device according to claim 3, wherein each said data line has another switching element connected thereto, said another switching element comprising a MOS transistor having a drain region and source region thereof formed within the well layer of that column of memory cells, and each of said another switching element connecting a local data line, connected to a corresponding column of memory cells, to a main data line, and each of said blocks further has, in each column associated therewith, said data line and a respective said another switching element, said another switching element of a column being disposed between the memory cell isolation region at the side of the drain regions in that column and the memory cell isolation region at the side of the source regions in that column.

13. A method of using a semiconductor memory device according to claim 9, wherein the voltage applied to a gate terminal of the switching element connected to each source line is equal to the voltage applied to the well wiring, and the voltage applied to the common source line is equal to or more positive than the voltage applied to the gate terminal.

* * * * *